(12) United States Patent
Lu et al.

(10) Patent No.: US 11,990,331 B2
(45) Date of Patent: May 21, 2024

(54) METHOD FOR FORMING SILICON DIOXIDE FILM AND METHOD FOR FORMING METAL GATE

(71) Applicant: CHANGXIN MEMORY TECHNOLOGIES, INC., Hefei (CN)

(72) Inventors: Jingwen Lu, Hefei (CN); Wei Feng, Hefei (CN); Bingyu Zhu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 227 days.

(21) Appl. No.: 17/398,075

(22) Filed: Aug. 10, 2021

(65) Prior Publication Data

US 2021/0391169 A1    Dec. 16, 2021

Related U.S. Application Data

(63) Continuation of application No. PCT/CN2021/095747, filed on May 25, 2021.

(30) Foreign Application Priority Data

Jun. 15, 2020  (CN) .......................... 202010545225.0

(51) Int. Cl.
*H01L 21/02* (2006.01)
*H01L 21/324* (2006.01)

(52) U.S. Cl.
CPC .. *H01L 21/02164* (2013.01); *H01L 21/02332* (2013.01); *H01L 21/02334* (2013.01); *H01L 21/324* (2013.01)

(58) Field of Classification Search
CPC ......... H01L 21/02164; H01L 21/02332; H01L 21/02334; H01L 21/324
See application file for complete search history.

(56) References Cited

U.S. PATENT DOCUMENTS

| | | | |
|---|---|---|---|
| 5,013,692 A | 5/1991 | Ide | |
| 6,555,485 B1 | 4/2003 | Liu | |
| 2002/0168855 A1* | 11/2002 | Smythe | H01L 21/02271 257/E21.576 |
| 2008/0050882 A1* | 2/2008 | Bevan | H01L 21/02181 257/E21.294 |
| 2010/0065901 A1* | 3/2010 | Tran | H01L 29/792 257/E21.294 |
| 2016/0293620 A1* | 10/2016 | Ogata | H01L 21/0214 |

(Continued)

FOREIGN PATENT DOCUMENTS

| | | |
|---|---|---|
| CN | 1402307 A | 3/2003 |
| CN | 101290886 A | 10/2008 |
| CN | 102789973 A | 11/2012 |

(Continued)

*Primary Examiner* — Monica D Harrison
*Assistant Examiner* — Andre C Stevenson
(74) *Attorney, Agent, or Firm* — Cooper Legal Group, LLC

(57) ABSTRACT

A method for forming a silicon dioxide film and a method for forming a metal gate are provided. The method for forming a silicon dioxide film includes: forming a silicon dioxide layer on a semiconductor substrate, performing a nitrogen treatment to the silicon dioxide layer to convert the silicon dioxide layer of partial thickness into a mixed layer of silicon nitride and silicon oxynitride; and removing the mixed layer to form a silicon dioxide film on the semiconductor substrate.

18 Claims, 7 Drawing Sheets

(56) References Cited

U.S. PATENT DOCUMENTS

2019/0319104 A1* 10/2019 Levy .................... H01L 29/518
2020/0105897 A1* 4/2020 Hsu ...................... H01L 29/516

FOREIGN PATENT DOCUMENTS

| DE | 3832450 A1 * | 4/1989 | ......... H01L 21/0214 |
| TW | 200802618 A | 1/2008 | |
| WO | 2008055150 A2 | 5/2008 | |

* cited by examiner

METHOD FOR FORMING SILICON DIOXIDE FILM AND METHOD FOR FORMING METAL GATE

CROSS-REFERENCE TO RELATED APPLICATIONS

The present application is a continuation application of International Application No. PCT/CN2021/095747, filed on May 25, 2021, which claims priority to Chinese patent application No. 202010545225.0, filed on Jun. 15, 2020. International Application No. PCT/CN2021/095747 and Chinese patent application No. 202010545225.0 are hereby incorporated by reference in their entireties.

BACKGROUND

With the continuous development of semiconductor technology, the sizes of semiconductor devices are shrinking continuously, and the sizes of structures of various parts in the semiconductor devices are also shrinking in proportion. Taking the MOS transistor as an example, with the overall size of the MOS transistor continuously shrinking, the size of source/drain area and a gate structure of the MOS transistor are also continuously reduced, and the thickness of a gate dielectric layer is also continuously reduced accordingly. However, because the gate dielectric layer is too thin, a breakdown voltage of the gate dielectric layer decreases, and a leakage current between a gate electrode and a channel region increases, which makes a device unable to work normally. In order to improve an electrical performance of the MOS transistor and reduce the leakage current between the gate electrode and the channel region, a metal gate formed by a laminated construction of a high-K gate dielectric layer and a metal gate electrode is introduced into the MOS transistor.

Since a high dielectric constant of a high-K material causes a problem of channel carriers dropping, which leads to an increase in a threshold, it is generally necessary to prepare an ultra-thin (e.g., thickness is less than 5 nm, particularly, may be 1 nm) and high-quality silicon dioxide layer as a buffer between the high-K gate dielectric layer and a silicon base (or a semiconductor substrate). However, it is difficult to stably control a growth thickness of such ultra-thin silicon dioxide layer by general low pressure chemical vapor deposition (LPCVD) or atomic layer deposition (ALD), and it is also difficult to control a natural oxide layer formed on the silicon substrate. There is therefore a need to introduce a new method for preparing an ultra-thin and controllable silicon dioxide layer.

SUMMARY

The present disclosure relates to the field of semiconductors, and more particularly, to a method for forming an ultra-thin silicon dioxide film and a method for forming a metal gate.

According to some embodiments of the disclosure, the present disclosure provides a method for forming a silicon dioxide film, which may include operations as follows.

A semiconductor substrate is provided.

A silicon dioxide layer is formed on the semiconductor substrate.

A nitrogen treatment is performed to the silicon dioxide layer, such that the silicon dioxide layer of partial thickness is converted into a mixed layer of silicon nitride and silicon oxynitride.

The mixed layer is removed and a silicon dioxide film is formed on the semiconductor substrate.

According to some embodiments of the disclosure, the present disclosure also provides a method for forming a metal gate, which may include the operations as follows.

A semiconductor substrate is provided.

A silicon dioxide film is formed on the semiconductor substrate with the foregoing method.

A high-K gate dielectric layer is formed on the silicon dioxide film. and

A metal gate electrode is formed on the high-K gate dielectric layer.

DETAILED DESCRIPTION

As described in BACKGROUND, it's difficult to form an ultra-thin silicon dioxide film by existing processes.

To this end, the present disclosure provides a method for forming a silicon dioxide film and a method for forming a metal gate. In the method for forming a silicon dioxide film, after a silicon dioxide layer is formed on a semiconductor substrate, the silicon dioxide layer is subjected to a nitrogen treatment, such that the silicon dioxide layer of partial thickness is converted into a mixed layer of silicon nitride and silicon oxynitride; the mixed layer is removed and a silicon dioxide film is formed on the semiconductor substrate. The finally remained silicon dioxide layer is ultra-thin by the combination of the foregoing specific operations, and the thickness and thickness uniformity of the formed silicon dioxide film are controllable.

In order to make the above objects, features, and advantages of the present disclosure be more apparent and understandable, specific implementations of the present disclosure will be described in detail with reference to the accompanying drawings. When describing the examples of the present disclosure in detail, for convenience of description, the schematic diagram will be partially enlarged without a normal proportion, and the schematic diagram is only an example, which herein should not limit the protection scope of the present disclosure. In addition, three-dimensional space dimensions of length, width, and depth should be contained in actual production.

Figure 1:
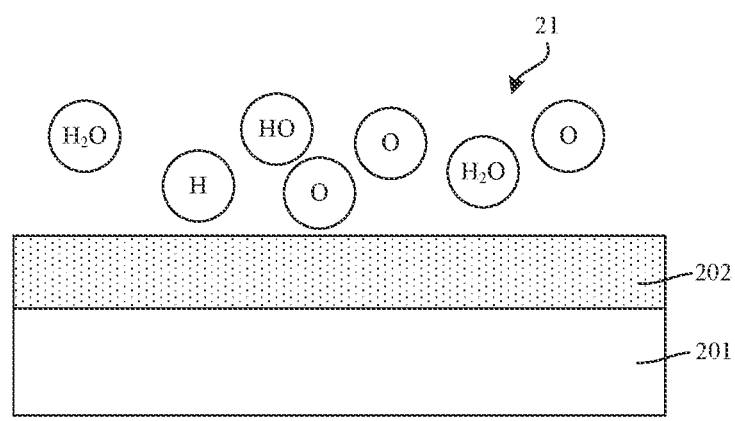
FIGS. 1-5 are schematic structure diagrams for illustration of a procedure for forming a silicon dioxide film according to an embodiment of the disclosure

Referring to FIG. 1, a semiconductor substrate 201 is provided. A silicon dioxide layer 202 is formed on the semiconductor substrate 201.

The material of the semiconductor substrate 201 may be silicon (Si), germanium (Ge), or silicon germanium (GeSi), silicon carbide (SiC), and may also be silicon-on-insulator (SOD, germanium-on-insulator (GOI), or other materials, e.g. gallium arsenide and other III-V compounds. In the present embodiment, the material of the semiconductor substrate 201 is silicon. Certain impurity ions are doped in the semiconductor substrate 201 as required. The impurity ions may be N-type impurity ions or P-type impurity ions.

A process for forming the silicon dioxide layer 202 is the in-situ steam generation (ISSG) 21, the thickness uniformity of the silicon dioxide layer 202 formed by the ISSG 21 is better, and the film performance is higher, so that an ultra-thin silicon dioxide film may be formed by subsequent processes.

In an embodiment, gases introduced into a reaction chamber during the ISSG 21 include O₂ and H₂, a reaction temperature is 600-900° C., and may further be 700-800° C., a pressure in an reaction chamber is 50-200 pa, and may further be 100-150 pa, thereby improving the thickness uniformity of the formed silicon dioxide layer 202. In addition, the ISSG process can heat and cool a silicon wafer in a short time, with less thermal budget, and the temperature uniformity is better. Herein by introducing a small amount of H₂ as a catalyst into an atmosphere of O₂, a chemical reaction similar to combustion occurs on the surface of the silicon wafer at a high temperature, which generates a large number of gas-phase active free radicals that participate in an oxidation process of the silicon wafer. Due to the strong oxidation effect of oxygen, the finally obtained oxide film has few defects within the film. That is, the oxide film has high quality, and the thickness uniformity is better at the same time.

In an example, the thickness of the formed silicon dioxide layer 202 may be 5-20 nm, and may further be 8-12 nm. The thickness uniformity of the silicon dioxide layer 202 can be well controlled within this range, so that the ultra-thin silicon dioxide film can be formed by the subsequent processes.

Figure 2:
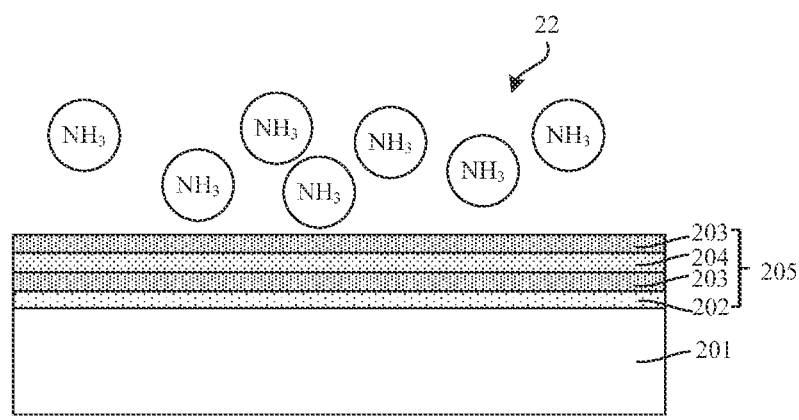

Referring to FIG. 2, the silicon dioxide layer 202 is subjected to a nitrogen treatment 22, converting the silicon dioxide layer of partial thickness into a mixed layer of silicon nitride and silicon oxynitride.

The silicon dioxide layer 202 of most thickness is converted into the mixed layer 205 of silicon nitride and silicon oxynitride after the nitrogen treatment 22, and only keeping a partial thickness of the silicon dioxide layer 202 thickness at the bottom unconverted. In an embodiment, the thickness of the converted silicon dioxide layer is ⅘-¹⁹/₂₀ of the total thickness of the silicon dioxide layer 202.

In an embodiment, the nitrogen treatment 22 is an ammonia-containing plasma processing. During the ammonia-containing plasma processing, ammonia-containing plasma is implanted into the silicon dioxide layer 202. The concentration of the ammonia-containing plasma implanted into the middle region is the highest, and the silicon dioxide layer in the middle region is completely nitride into silicon nitride. Therefore, the silicon nitride and the silicon oxynitride in the formed mixed layer 205 are layered. Specifically, the mixed layer 205 includes two silicon oxynitride layers 203 and one silicon nitride layer 204 between the two 1 silicon oxynitride layers 203.

In an embodiment, the thickness of the nitride silicon oxide layer may be controlled by controlling the nitriding parameters. Specifically, by controlling plasma strength (the power of the plasma source), the chamber temperature, and time for nitriding, the depth of implantation may be controlled. Therefore, the thickness of the remaining silicon dioxide layer (or thus formed silicon dioxide film) can be controlled, i.e. the thickness of the silicon dioxide film is controllable. In a specific embodiment, NH₃ is adopted in the nitrogen treatment 22. A chamber temperature is 600-800° C., and may further be 650-750° C. A chamber pressure is 1-10 pa. A power of a plasma source (plasma strength) is 600-2000 W, and may further be 1100-1500 W.

The principle of a nitrogen treatment using ammonia-containing plasma is as follows Ammonia gas (NH₃) is introduced into a reaction chamber; the ammonia gas (NH3) is plasma ionized or dissociated under the action of a radio frequency power (power of the plasma source), forming an ammonia-containing plasma; and the ammonia-containing plasma reacts with the silicon dioxide layer 202 of partial thickness to form the mixed layer 205. The specific reaction formulas are as follows:

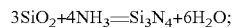
$$3SiO_2+4NH_3=Si_3N_4+6H_2O;$$

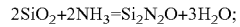
$$2SiO_2+2NH_3=Si_2N_2O+3H_2O;$$

Figure 3:
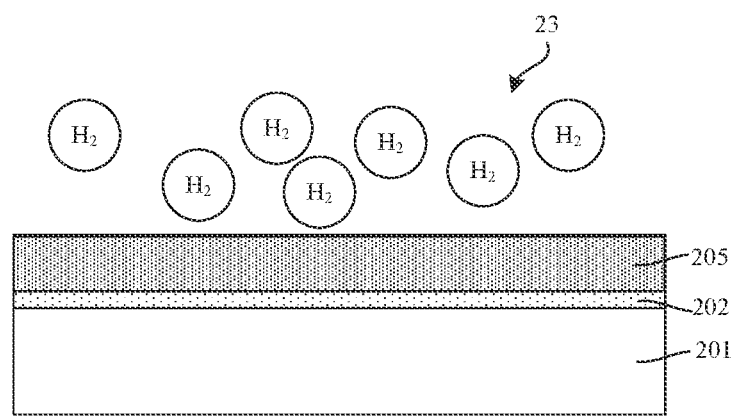

In an example, referring to FIG. 3, after performing the nitrogen treatment 22 (referring to FIG. 2) and before removing the mixed layer, a further operation may be included. The mixed layer 205 of silicon nitride and silicon oxynitride is subjected to a reduction treatment 23, converting the silicon oxynitride in the mixed layer 205 into silicon nitride. After performing the reduction treatment 23 all the silicon oxynitride material in the mixed layer 205 is completely converted into silicon nitride. That is, after performing the reduction treatment 23, all the materials in the mixed layer 205 are completely changed into silicon nitride, so that the material of the mixed layer 205 is single. Therefore, the reduced mixed layer 205 may be simply and accurately removed subsequently by etching process, so that the thickness accuracy and thickness uniformity of the finally formed ultra-thin silicon dioxide film are improved, and the device performance is improved. It can be understood that if the materials in the mixed layer are non-uniform, an etching rate at different locations may be different during subsequent etching processes, resulting in a lower uniformity in the film thickness of the finally formed silicon dioxide.

In an example, the reduction treatment 23 is hydrogen-containing plasma treatment.

In a specific example, the gas adopted in the reduction treatment 23 is H₂. A chamber temperature is 800° C.-900° C. A chamber pressure is 1 Pa-10 Pa, and may further be 4-6 pa. A power of the plasma source (plasma intensity) is 600 W-2000 W, and may further be 1000-1500 W, so that the silicon oxynitride in the mixed layer is completely converted into silicon nitride, and energy can be saved to the maximum extent at the same time.

The principle of performing the reduction treatment 23 by adopting a hydrogen-containing plasma treatment is as follows. Hydrogen (H₂) is introduced into a reaction chamber, hydrogen (H₂) is plasma ionized or dissociated under the action of a radio frequency power (a power of the plasma source), forming hydrogen-containing plasma.; the hydrogen-containing plasma reacts with the silicon oxynitride in the mixed layer 205, converting the silicon oxynitride in the mixed layer 205 to silicon nitride. The specific reaction formula is as follows:

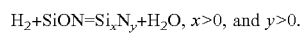
$$H_2+SiON=Si_xN_y+H_2O,\ x>0,\ \text{and}\ y>0.$$

Figure 4:
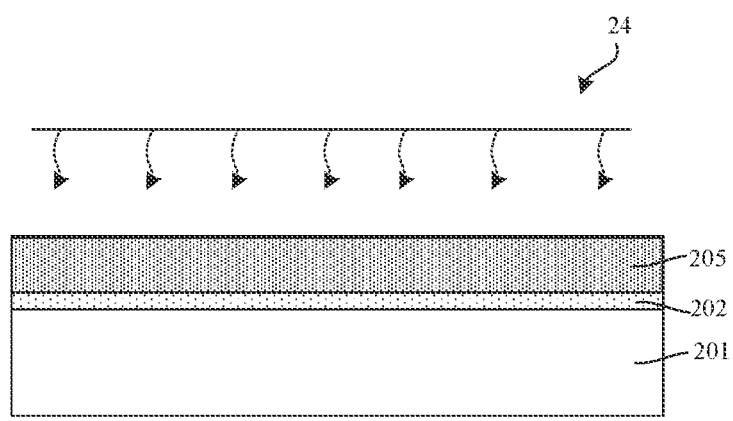

In an example, referring to FIG. 4, after performing the reduction treatment 23 (referring to FIG. 3) and before removing the mixed layer 205, the method further includes an operation of a rapid thermal annealing processing (RTP) 24.

The purpose of the RTP 24 is: for repairing lattice defects of the materials in the mixed layer 205 after the nitrogen treatment. If none thermal annealing is carried out, there will be defects in the mixed layer 205. During removing the mixed layer 205 after the nitrogen treatment, due to the influence of the defects, an etching rate at different locations may be influenced, which will affect the overall etching uniformity, and then affect the uniformity of the silicon dioxide film interface after etching.

In an example, an annealing temperature of the RTP 24 is 1000-1200° C.

Figure 5:
Figure 6:
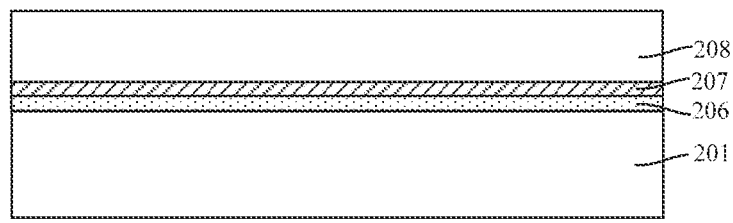
FIGS. 6-7 are schematic structure diagrams for illustration of a procedure for forming a metal gate according to an embodiment of the disclosure.

Referring to FIG. 5, after performing the reduction treatment 23, the mixed layer 205 is removed (referring to FIG. 3 or 4), a silicon dioxide film 206 is formed on the semiconductor substrate 201

The formed silicon dioxide film 206 is an ultra-thin silicon dioxide layer. The thickness of the formed silicon dioxide film 206 is 0.5 nm-5 nm, may be 0.5 nm, 1 nm, 1.5 nm, or 2 nm. In the present example, the thickness of the silicon dioxide film 206 is 1 nm.

The operation of removing the mixed layer 205 may be performed directly after performing the reduction treatment. In another example, the operation of removing the mixed layer 205 may be performed after performing the RTP.

The mixed layer 205 is removed by adopting an anisotropic dry etching process. In an example, the anisotropic dry etching process is a plasma etching process. Etching gases adopted by the plasma etching process are $CF_4$ and $O_2$, and a power is 200-500 W. In other examples, the mixed layer 205 may also be removed by wet etching. Specifically, the mixed layer 205 may be removed with hot phosphoric acid.

In the present disclosure, an ultra-thin silicon dioxide film can be formed by the foregoing specific operations and methods, and the thickness and thickness uniformity of the ultra-thin silicon dioxide film are controllable.

The present disclosure also provides a method for forming a metal gate, Referring to FIG. 5, a semiconductor substrate 201 is provided; a silicon dioxide film 206 is formed on the semiconductor substrate 201 with the foregoing method.

Shallow Trench Isolation structures (STI, not shown in the figure) may be formed in the semiconductor substrate 201. Each of the Shallow Trench Isolation structures is used for isolating each two adjacent active regions.

The thickness of the silicon dioxide film 206 is 0.5 nm-5 nm. The specific forming process of the silicon dioxide film 206 may refer to the above examples, and will not repeat herein.

By forming the ultra-thin silicon dioxide film, when a metal gate is subsequently formed, drops of carriers in channel regions can be prevented With continued reference to FIG. 1, a high-K material layer 207 and a metal layer 208 on the high-K material layer 207 are formed on the silicon dioxide film 206.

The dielectric constant (K) of the high-K material layer 207 is more than 2.5. A material of high-K material layer 207 is one or more of $HfO_2$, $Al_2O_3$, $ZrO_2$, HfSiO, HfSiON, HfTaO, and HfZrO. A material of the metal layer 208 is one or more of W, Al, Cu, Ti, Ta, Co, TaN, NiSi, CoSi, TiN, TiAl, and TaSiN.

The high-K material layer 207 and the metal layer 208 may be formed by adopting a physical vapor deposition or a sputtering process.

Figure 7:
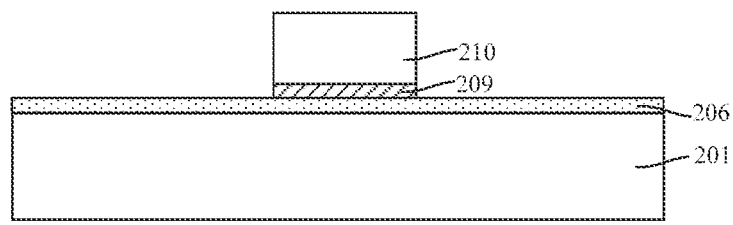

Referring to FIG. 7, the high-K material layer 207 and the metal layer 208 are etched to form a high-K gate dielectric layer 209 and a metal gate electrode 210 on the high-K gate dielectric layer 209 on the silicon dioxide film 206.

In other examples, the high-K gate dielectric layer 209 and the metal gate electrode 210 may also be formed by a gate-last process. Specifically, an ultra-thin silicon dioxide layer 206 and a high-K material layer 207 on the silicon dioxide layer 206 are formed on a semiconductor substrate 201. A sacrificial gate is formed on the high-K material layer 207. The sacrificial gate may be made of polysilicon. Source/drain region is formed in the semiconductor substrate at either side of the sacrificial gate. A dielectric layer is formed on the semiconductor substrate 201. The surface of the dielectric layer is flush with the surface of the sacrificial gate. The sacrificial gate is removed. The position where the sacrificial gate is removed is filled with metal to form a metal gate electrode 210.

Although the present disclosure has been disclosed in terms of preferred examples, it is not intended to limit the present disclosure. Any person skilled in the art, without departing from the spirit and scope of the present disclosure, may make possible variations and modifications to the technical solutions of the present disclosure using the methods and techniques contents disclosed above. Therefore, any simple modifications, equivalent variations and modifications made on the above examples according to the technical essence of the present disclosure without departing from the contents of the technical solutions of the present disclosure fall within the scopes of protection of the technical solutions of the present disclosure.

The invention claimed is:

1. A method for forming a silicon dioxide film, comprising:
    providing a semiconductor substrate;
    forming a silicon dioxide layer on the semiconductor substrate;
    performing a nitrogen treatment to the silicon dioxide layer, such that a first portion of the silicon dioxide layer occupying a portion of a thickness of the silicon dioxide layer and disposed away from the semiconductor substrate is converted into a mixed layer of silicon nitride and silicon oxynitride, and a remaining portion of the silicon dioxide layer in contact with the semiconductor substrate is kept; and
    removing the mixed layer such that the remaining portion of the silicon dioxide layer forms a silicon dioxide film on the semiconductor substrate.

2. The method for forming a silicon dioxide film according to claim 1, wherein after performing the nitrogen treatment to the silicon dioxide layer and before removing the mixed layer, the method further comprises:
    performing a reduction treatment to the mixed layer to convert the silicon oxynitride in the mixed layer into the silicon nitride.

3. The method for forming a silicon dioxide film according to claim 2, wherein the reduction treatment is a hydrogen-containing plasma process.

4. The method for forming a silicon dioxide film according to claim 3, wherein $H_2$ is adopted in the reduction treatment, a chamber temperature is 800-900° C., a chamber pressure is 1-10 Pa, and a power of a plasma source is 600-2000 W.

5. A method for forming a metal gate, comprising:
    providing the semiconductor substrate;
    forming the silicon dioxide film on the semiconductor substrate with the method of claim 4;
    forming a high-K gate dielectric layer on the silicon dioxide film; and
    forming a metal gate electrode on the high-K gate dielectric layer.

6. A method for forming a metal gate, comprising:
    providing the semiconductor substrate;
    forming the silicon dioxide film on the semiconductor substrate with the method of claim 3;
    forming a high-K gate dielectric layer on the silicon dioxide film; and
    forming a metal gate electrode on the high-K gate dielectric layer.

7. The method for forming a silicon dioxide film according to claim 2, wherein after the reduction treatment and before removing the mixed layer, the method further comprises:
performing a rapid thermal annealing process.

8. A method for forming a metal gate, comprising:
providing the semiconductor substrate;
forming the silicon dioxide film on the semiconductor substrate with the method of claim 7;
forming a high-K gate dielectric layer on the silicon dioxide film; and
forming a metal gate electrode on the high-K gate dielectric layer.

9. A method for forming a metal gate, comprising:
providing the semiconductor substrate;
forming the silicon dioxide film on the semiconductor substrate with the method of claim 2;
forming a high-K gate dielectric layer on the silicon dioxide film; and
forming a metal gate electrode on the high-K gate dielectric layer.

10. The method for forming a silicon dioxide film according to claim 1, wherein forming the silicon dioxide layer comprises forming the silicon dioxide layer with an in-situ steam generation (ISSG) process.

11. The method for forming a silicon dioxide film according to claim 10, wherein gases introduced into a reaction chamber during performing the ISSG process comprise $O_2$ and $H_2$, a reaction temperature is 600-900° C., and a reaction chamber pressure is 50-200 Pa.

12. A method for forming a metal gate, comprising:
providing the semiconductor substrate;
forming the silicon dioxide film on the semiconductor substrate with the method of claim 11;
forming a high-K gate dielectric layer on the silicon dioxide film; and
forming a metal gate electrode on the high-K gate dielectric layer.

13. A method for forming a metal gate, comprising:
providing the semiconductor substrate;
forming the silicon dioxide film on the semiconductor substrate with the method of claim 10;
forming a high-K gate dielectric layer on the silicon dioxide film; and
forming a metal gate electrode on the high-K gate dielectric layer.

14. The method for forming a silicon dioxide film according to claim 1, wherein the nitrogen treatment is an ammonia-containing plasma process, a gas adopted in the nitrogen treatment is $NH_3$, a chamber temperature is 600-800° C., a chamber pressure is 1-10 Pa, and a power of a plasma source is 600-2000 W.

15. A method for forming a metal gate, comprising:
providing the semiconductor substrate;
forming the silicon dioxide film on the semiconductor substrate with the method of claim 14;
forming a high-K gate dielectric layer on the silicon dioxide film; and
forming a metal gate electrode on the high-K gate dielectric layer.

16. The method for forming a silicon dioxide film according to claim 1, wherein the thickness of the silicon dioxide film is 0.5 nm-5 nm.

17. A method for forming a metal gate, comprising:
providing the semiconductor substrate;
forming the silicon dioxide film on the semiconductor substrate with the method of claim 16;
forming a high-K gate dielectric layer on the silicon dioxide film; and
forming a metal gate electrode on the high-K gate dielectric layer.

18. A method for forming a metal gate, comprising:
providing the semiconductor substrate;
forming the silicon dioxide film on the semiconductor substrate with the method of claim 1;
forming a high-K gate dielectric layer on the silicon dioxide film; and
forming a metal gate electrode on the high-K gate dielectric layer.

* * * * *